(12) United States Patent
Partridge et al.

(10) Patent No.: US 7,323,364 B2
(45) Date of Patent: Jan. 29, 2008

(54) STACKED MODULE SYSTEMS AND METHOD

(75) Inventors: Julian Partridge, Austin, TX (US); James Douglas Wehrly, Jr., Austin, TX (US); David Roper, Austin, TX (US)

(73) Assignee: Staktek Group L.P., Austin, TX (US)

( * ) Notice: Subject to any disclaimer, the term of this patent is extended or adjusted under 35 U.S.C. 154(b) by 53 days.

(21) Appl. No.: 11/411,185

(22) Filed: Apr. 25, 2006

(65) Prior Publication Data

US 2006/0263938 A1    Nov. 23, 2006

Related U.S. Application Data

(63) Continuation of application No. 11/131,812, filed on May 18, 2005, now Pat. No. 7,033,861.

(51) Int. Cl.
*H01L 21/44* (2006.01)
(52) U.S. Cl. .................... 438/109; 257/E23.034
(58) Field of Classification Search ............. 438/15, 438/25–26, 55, 64, 106–107, 109–110, 128; 361/735–736, 790, 749, 767
See application file for complete search history.

(56) References Cited

U.S. PATENT DOCUMENTS

| | | | |
|---|---|---|---|
| 3,411,122 A | 11/1968 | Schiller et al. | |
| 3,436,604 A | 4/1969 | Hyitin | |
| 3,654,394 A | 4/1972 | Gordon | |
| 3,746,934 A | 7/1973 | Stein | |
| 3,766,439 A | 10/1973 | Isaacson | |
| 3,772,776 A | 11/1973 | Weisenburger | |

(Continued)

FOREIGN PATENT DOCUMENTS

DE    564215457 A1    11/1992

(Continued)

OTHER PUBLICATIONS

PCT/US2006/017015, International Search Report and Written Opinion dated Oct. 17, 2006.

(Continued)

*Primary Examiner*—Michael Lebentritt
*Assistant Examiner*—Andre Stevenson
(74) *Attorney, Agent, or Firm*—Fish & Richardson P.C.

(57) ABSTRACT

A combination composed from a form standard and a CSP is attached to flex circuitry. Solder paste is applied to first selected locations on the flex circuitry and adhesive is applied to second selected locations on the flex circuitry. The flex circuitry and the combination of the form standard and CSP are brought into proximity with each other. During solder reflow operation, a force is applied that tends to bring the combination and flex circuitry closer together. As the heat of solder reflow melts the contacts of the CSP, the combination collapses toward the flex circuitry displacing the adhesive as the solder paste and contacts merge into solder joints. In a preferred embodiment, the form standard will be devised of heat transference material, a metal, for example, such as copper would be preferred, to improve thermal performance. In other embodiments, the methods of the invention may be used to attach a CSP without a form standard to flex circuitry.

21 Claims, 3 Drawing Sheets

U.S. PATENT DOCUMENTS

| | | |
|---|---|---|
| 3,806,767 A | 4/1974 | Lehrfeld |
| 3,983,547 A | 9/1976 | Almasi |
| 4,079,511 A | 3/1978 | Grabbe |
| 4,288,841 A | 9/1981 | Gogal |
| 4,381,421 A | 4/1983 | Coats et al. |
| 4,406,508 A | 9/1983 | Sadigh-Behzadi |
| 4,420,794 A | 12/1983 | Anderson |
| 4,437,235 A | 3/1984 | McIver |
| 4,513,368 A | 4/1985 | Houseman |
| 4,587,596 A | 5/1986 | Bunnell |
| 4,645,944 A | 2/1987 | Uya |
| 4,696,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,903,169 A | 2/1990 | Kitagawa et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,050,039 A | 9/1991 | Edfors |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow, III et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,641 A | 7/1993 | Katayama |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,281,852 A | 1/1994 | Normington |
| 5,289,062 A | 2/1994 | Wyland |
| 5,289,346 A | 2/1994 | Carey et al. |
| 5,313,097 A | 5/1994 | Haj-Ali-Ahmadi et al. |
| 5,337,388 A | 8/1994 | Jacobowitz et al. |
| 5,343,366 A | 8/1994 | Cipolla et al. |
| 5,345,205 A | 9/1994 | Kornrumpf |
| 5,347,159 A | 9/1994 | Khandros et al. |
| 5,347,428 A | 9/1994 | Carson et al. |
| 5,357,478 A | 10/1994 | Kikuda et al. |
| 5,361,228 A | 11/1994 | Adachi et al. |
| 5,362,656 A | 11/1994 | McMahon |
| 5,375,041 A | 12/1994 | McMahon |
| 5,384,690 A | 1/1995 | Davis et al. |
| 5,386,341 A | 1/1995 | Olson et al. |
| 5,394,303 A | 2/1995 | Yamaji |
| 5,396,573 A | 3/1995 | Ecker et al. |
| 5,397,916 A | 3/1995 | Normington |
| 5,428,190 A | 6/1995 | Stopperan |
| 5,432,630 A | 7/1995 | Lebby et al. |
| 5,438,224 A | 8/1995 | Papageorge et al. |
| 5,448,511 A | 9/1995 | Paurus et al. |
| 5,477,082 A | 12/1995 | Buckley, III et al. |
| 5,484,959 A | 1/1996 | Burns |
| 5,502,333 A | 3/1996 | Bertin et al. |
| 5,509,197 A | 4/1996 | Stone |
| 5,516,989 A | 5/1996 | Uedo et al. |
| 5,523,619 A | 6/1996 | McAllister et al. |
| 5,523,695 A | 6/1996 | Lin |
| 5,572,065 A | 11/1996 | Burns |
| 5,588,205 A | 12/1996 | Roane |
| 5,594,275 A | 1/1997 | Kwon et al. |
| 5,610,833 A | 3/1997 | Chang et al. |
| 5,612,570 A | 3/1997 | Eide et al. |
| 5,620,782 A | 4/1997 | Davis et al. |
| 5,631,193 A | 5/1997 | Burns |
| 5,642,055 A | 6/1997 | Difrancesco |
| 5,644,839 A | 7/1997 | Stone |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,717,556 A | 2/1998 | Yanagida |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A | 7/1998 | Nicewarner, Jr. et al. |
| 5,778,522 A | 7/1998 | Burns |
| 5,783,464 A | 7/1998 | Burns |
| 5,789,815 A | 8/1998 | Tessier et al. |
| 5,801,439 A | 9/1998 | Fujisawa et al. |
| 5,804,870 A | 9/1998 | Burns |
| 5,805,422 A | 9/1998 | Otake et al. |
| 5,835,988 A | 11/1998 | Ishii |
| 5,841,721 A | 11/1998 | Kwon et al. |
| 5,852,326 A | 12/1998 | Khandros et al. |
| 5,869,353 A | 2/1999 | Levy et al. |
| 5,895,969 A | 4/1999 | Masuda et al. |
| 5,895,970 A | 4/1999 | Miyoshi et al. |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |
| 5,926,369 A | 7/1999 | Ingraham et al. |
| 5,933,712 A | 8/1999 | Bernhardt et al. |
| 5,949,657 A | 9/1999 | Karabatsos |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |

| | | | |
|---|---|---|---|
| 6,013,948 A | 1/2000 | Akram et al. | |
| 6,014,316 A | 1/2000 | Eide | |
| 6,028,352 A | 2/2000 | Eide | |
| 6,028,365 A | 2/2000 | Akram et al. | |
| 6,034,878 A | 3/2000 | Osaka et al. | |
| 6,040,624 A | 3/2000 | Chambers et al. | |
| 6,072,233 A | 6/2000 | Corisis et al. | |
| 6,084,293 A | 7/2000 | Ohuchi | |
| 6,084,294 A | 7/2000 | Tomita | |
| 6,084,778 A | 7/2000 | Malhi | |
| 6,097,087 A | 8/2000 | Farnworth et al. | |
| 6,102,710 A | 8/2000 | Beilin et al. | |
| 6,111,761 A | 8/2000 | Peana et al. | |
| 6,114,763 A | 9/2000 | Smith | |
| 6,121,676 A | 9/2000 | Solberg | |
| RE36,916 E | 10/2000 | Moshayedi | |
| 6,130,477 A | 10/2000 | Chen et al. | |
| 616,643 A | 12/2000 | Inaba et al. | |
| 6,157,541 A | 12/2000 | Hacke | |
| 6,165,817 A | 12/2000 | Akram | |
| 6,172,874 B1 | 1/2001 | Bartilson | |
| 6,178,093 B1 | 1/2001 | Bhatt et al. | |
| 6,186,106 B1 | 2/2001 | Glovatsky | |
| 6,187,652 B1 | 2/2001 | Chou et al. | |
| 6,205,654 B1 | 3/2001 | Burns | |
| 6,208,521 B1 | 3/2001 | Nakatsuka | |
| 6,218,731 B1 | 4/2001 | Huang et al. | |
| 6,222,737 B1 | 4/2001 | Ross | |
| 6,225,688 B1 | 5/2001 | Kim et al. | |
| 6,233,650 B1 | 5/2001 | Johnson et al. | |
| 6,234,820 B1 | 5/2001 | Perino et al. | |
| 6,236,565 B1 | 5/2001 | Gordon | |
| 6,262,895 B1 | 7/2001 | Forthun | |
| 6,265,766 B1 | 7/2001 | Moden | |
| 6,265,860 B1 | 7/2001 | Eguchi et al. | |
| 6,266,252 B1 | 7/2001 | Karabatsos | |
| 6,271,058 B1 | 8/2001 | Yoshida | |
| 6,272,741 B1 | 8/2001 | Kennedy et al. | |
| 6,281,577 B1 | 8/2001 | Oppermann et al. | |
| 6,285,560 B1 | 9/2001 | Lyne | |
| 6,288,907 B1 | 9/2001 | Burns | |
| 6,300,679 B1 | 10/2001 | Mukerji et al. | |
| 6,303,981 B1 | 10/2001 | Moden | |
| 6,310,392 B1 | 10/2001 | Burns | |
| 6,313,998 B1 | 11/2001 | Kledzik | |
| 6,316,825 B1 | 11/2001 | Park et al. | |
| 6,320,137 B1 | 11/2001 | Bonser et al. | |
| 6,323,060 B1 * | 11/2001 | Isaak | 438/109 |
| 6,329,708 B1 | 12/2001 | Komiyama | |
| 6,336,262 B1 | 1/2002 | Dalal et al. | |
| 6,351,029 B1 | 2/2002 | Isaak | |
| 6,360,433 B1 | 3/2002 | Ross | |
| 6,360,935 B1 | 3/2002 | Flake | |
| 6,368,896 B2 | 4/2002 | Farnworth et al. | |
| 6,376,769 B1 | 4/2002 | Chung | |
| 6,384,339 B1 | 5/2002 | Neuman | |
| 6,392,162 B1 | 5/2002 | Karabatsos | |
| 6,410,857 B1 | 6/2002 | Gonya | |
| 6,414,384 B1 | 7/2002 | Lo et al. | |
| 6,423,622 B1 | 7/2002 | Chen et al. | |
| 6,426,240 B2 | 7/2002 | Isaak | |
| 6,426,549 B1 | 7/2002 | Isaak | |
| 6,426,560 B1 | 7/2002 | Kawamura et al. | |
| 6,433,418 B1 | 8/2002 | Fujisawa et al. | |
| 6,437,990 B1 | 8/2002 | Degani et al. | |
| 6,444,490 B2 * | 9/2002 | Bertin et al. | 438/107 |
| 6,444,921 B1 | 9/2002 | Wang et al. | |
| 6,446,158 B1 | 9/2002 | Karabatsos | |
| 6,447,321 B1 | 9/2002 | Perino et al. | |
| 6,449,159 B1 | 9/2002 | Haba | |
| 6,452,826 B1 | 9/2002 | Kim et al. | |
| 6,462,408 B1 | 10/2002 | Wehrly, Jr. | |
| 6,462,412 B2 | 10/2002 | Kamei et al. | |
| 6,462,423 B1 | 10/2002 | Akram et al. | |
| 6,465,877 B1 | 10/2002 | Farnworth et al. | |
| 6,465,893 B1 | 10/2002 | Khandros et al. | |
| 6,473,308 B2 | 10/2002 | Forthun | |
| 6,486,544 B1 | 11/2002 | Hashimoto | |
| 6,487,078 B2 | 11/2002 | Kledzik et al. | |
| 6,489,178 B2 | 12/2002 | Coyle et al. | |
| 6,489,687 B1 | 12/2002 | Hashimoto | |
| 6,492,718 B2 | 12/2002 | Ohmori | |
| 6,500,697 B2 | 12/2002 | Ahmad | |
| 6,504,104 B2 | 1/2003 | Hacke et al. | |
| 6,509,639 B1 | 1/2003 | Lin | |
| 6,514,793 B2 | 2/2003 | Isaak | |
| 6,522,018 B1 | 2/2003 | Tay et al. | |
| 6,528,870 B2 | 3/2003 | Fukatsu et al. | |
| 6,532,162 B2 | 3/2003 | Schoenborn | |
| 6,538,895 B2 | 3/2003 | Worz et al. | |
| 6,549,413 B2 | 4/2003 | Karnezos et al. | |
| 6,552,910 B1 | 4/2003 | Moon et al. | |
| 6,559,521 B2 | 5/2003 | Tuttle | |
| 6,560,117 B2 | 5/2003 | Moon | |
| 6,572,387 B2 | 6/2003 | Burns et al. | |
| 6,576,992 B1 * | 6/2003 | Cady et al. | 257/686 |
| 6,588,095 B2 | 7/2003 | Pan | |
| 6,590,282 B1 | 7/2003 | Wang et al. | |
| 6,600,222 B1 | 7/2003 | Levardo | |
| 6,608,763 B1 | 8/2003 | Burns et al. | |
| 6,614,664 B2 | 9/2003 | Lee | |
| 6,617,510 B2 | 9/2003 | Schreiber et al. | |
| 6,620,651 B2 | 9/2003 | He et al. | |
| 6,624,507 B1 | 9/2003 | Nguyen et al. | |
| 6,627,984 B2 | 9/2003 | Bruce et al. | |
| 6,646,333 B1 | 11/2003 | Hogerl | |
| 6,657,134 B2 | 12/2003 | Spielberger et al. | |
| 6,660,561 B2 | 12/2003 | Forthun | |
| 6,670,700 B1 | 12/2003 | Hashimoto | |
| 6,673,651 B2 | 1/2004 | Ohuchi et al. | |
| 6,677,670 B2 | 1/2004 | Kondo | |
| 6,683,377 B1 | 1/2004 | Shim et al. | |
| 6,689,634 B1 | 2/2004 | Lyne | |
| 6,690,584 B2 | 2/2004 | Uzuka et al. | |
| 6,699,730 B2 | 3/2004 | Kim et al. | |
| 6,707,148 B1 | 3/2004 | Mostafazadeh et al. | |
| 6,707,684 B1 | 3/2004 | Andric et al. | |
| 6,709,893 B2 | 3/2004 | Moden et al. | |
| 6,724,076 B1 | 4/2004 | Kahlisch et al. | |
| 6,746,894 B2 | 6/2004 | Fee et al. | |
| 6,762,495 B1 | 7/2004 | Reyes et al. | |
| 6,763,179 B1 | 7/2004 | Moon et al. | |
| 6,765,288 B2 | 7/2004 | Damberg | |
| 6,768,660 B2 | 7/2004 | Kong et al. | |
| 6,773,848 B1 | 8/2004 | Nortoft et al. | |
| 6,776,797 B1 | 8/2004 | Blom | |
| 6,778,404 B1 | 8/2004 | Bolken et al. | |
| 6,781,240 B2 | 8/2004 | Choi et al. | |
| 6,803,651 B1 | 10/2004 | Chiang | |
| 6,812,567 B2 | 11/2004 | Kim et al. | |
| 6,821,029 B1 | 11/2004 | Grung et al. | |
| 6,833,984 B1 | 12/2004 | Belgacem | |
| 6,841,855 B2 | 1/2005 | Jaeck et al. | |
| 6,849,949 B1 | 2/2005 | Lyu et al. | |
| 6,867,496 B1 | 3/2005 | Hashimoto | |
| 6,869,825 B2 | 3/2005 | Chiu | |
| 6,876,074 B2 | 4/2005 | Kim | |
| 6,879,047 B1 | 4/2005 | Heo | |
| 6,884,653 B2 | 4/2005 | Larson | |
| 6,891,729 B2 | 5/2005 | Ko et al. | |
| 6,893,897 B2 | 5/2005 | Sweterlitsch | |
| 6,908,792 B2 | 6/2005 | Bruce et al. | |
| 6,914,324 B2 | 7/2005 | Rapport et al. | |
| 6,919,626 B2 | 7/2005 | Burns | |
| 6,965,166 B2 | 11/2005 | Hikita et al. | |
| 6,998,704 B2 | 2/2006 | Yamazaki et al. | |

| | | | |
|---|---|---|---|
| 7,023,701 B2 | 4/2006 | Stocken et al. | |
| 7,081,373 B2 | 7/2006 | Roeters et al. | |
| 7,104,804 B2 | 9/2006 | Batinovich | |
| 7,129,571 B2 | 10/2006 | Kang | |
| 2001/0006262 A1 | 7/2001 | Kim et al. | |
| 2001/0013423 A1 | 8/2001 | Dalal et al. | |
| 2001/0015487 A1 | 8/2001 | Forthun | |
| 2001/0035572 A1 | 11/2001 | Isaak | |
| 2001/0040793 A1 | 11/2001 | Inaba | |
| 2002/0006032 A1 | 1/2002 | Karabatsos | |
| 2002/0030995 A1 | 3/2002 | Shoji | |
| 2002/0044423 A1 | 4/2002 | Primavera et al. | |
| 2002/0048849 A1 | 4/2002 | Isaak | |
| 2002/0076919 A1 | 6/2002 | Peters et al. | |
| 2002/0101261 A1 | 8/2002 | Karabatsos | |
| 2002/0114143 A1 | 8/2002 | Morrison et al. | |
| 2002/0126951 A1 | 9/2002 | Sutherland et al. | |
| 2002/0139577 A1 | 10/2002 | Miller | |
| 2002/0164838 A1 | 11/2002 | Moon et al. | |
| 2002/0180022 A1 | 12/2002 | Emoto | |
| 2003/0016710 A1 | 1/2003 | Kamoto | |
| 2003/0045025 A1 | 3/2003 | Coyle et al. | |
| 2003/0049886 A1 | 3/2003 | Salmon | |
| 2003/0081392 A1 | 5/2003 | Cady et al. | |
| 2003/0107118 A1 | 6/2003 | Pflughaupt et al. | |
| 2003/0109078 A1 | 6/2003 | Takahashi et al. | |
| 2003/0113998 A1 | 6/2003 | Ross | |
| 2003/0164551 A1 | 9/2003 | Lee et al. | |
| 2003/0168725 A1 | 9/2003 | Warner et al. | |
| 2004/0000708 A1 | 1/2004 | Rapport et al. | |
| 2004/0004281 A1 | 1/2004 | Bai et al. | |
| 2004/0021211 A1 | 2/2004 | Damberg | |
| 2004/0031972 A1 | 2/2004 | Pflughaupt et al. | |
| 2004/0045159 A1 | 3/2004 | DiStefano et al. | |
| 2004/0065963 A1 | 4/2004 | Kamezos | |
| 2004/0075991 A1 | 4/2004 | Haba et al. | |
| 2004/0099938 A1 | 5/2004 | Kang et al. | |
| 2004/0104470 A1 | 6/2004 | Bang et al. | |
| 2004/0115866 A1 | 6/2004 | Bang et al. | |
| 2004/0150107 A1 | 8/2004 | Cha et al. | |
| 2004/0157362 A1 | 8/2004 | Beroz et al. | |
| 2004/0203190 A1 | 10/2004 | Pflughaupt et al. | |
| 2004/0217461 A1 | 11/2004 | Damberg | |
| 2004/0217471 A1 | 11/2004 | Haba | |
| 2004/0238931 A1 | 12/2004 | Haba et al. | |
| 2004/0245617 A1 | 12/2004 | Damberg et al. | |
| 2004/0267409 A1 | 12/2004 | De Lorenzo et al. | |
| 2005/0018495 A1 | 1/2005 | Bhakta et al. | |
| 2005/0035440 A1 | 2/2005 | Mohammed | |
| 2005/0040508 A1 | 2/2005 | Lee | |
| 2005/0047250 A1 | 3/2005 | Ruckerbauer et al. | |
| 2005/0133897 A1 | 6/2005 | Baek et al. | |

FOREIGN PATENT DOCUMENTS

| | | |
|---|---|---|
| DE | 564214182 A1 | 12/1992 |
| EP | 0426-303 (A2) | 10/1990 |
| JP | 359865853 (A) | 5/1984 |
| JP | 60-254762 (A) | 12/1985 |
| JP | 60254762 | 12/1985 |
| JP | 3641047559 (A) | 3/1986 |
| JP | 62-230027 (A) | 8/1987 |
| JP | 4-209562 (A) | 7/1992 |
| JP | 44368157 (A) | 12/1992 |
| JP | 58-29534 (A) | 2/1993 |
| JP | 63-153849 (A) | 8/1998 |
| JP | 2000-88921 | 3/2000 |
| JP | 2000/307029 (A) | 11/2000 |
| JP | 2001/077294 (A) | 3/2001 |
| JP | 2001/085592 (A) | 3/2001 |
| JP | 2001/332683 (A) | 11/2001 |
| JP | 2006/337246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/309247 (A) | 10/2003 |
| JP | 2003/347475 (A) | 12/2003 |
| JP | 2003/347503 (A) | 12/2003 |
| WO | WO9744824 | 11/1997 |
| WO | WO 03/037853 A1 | 5/2003 |

OTHER PUBLICATIONS

PCT/US2005/013345, International Preliminary Report on Patentability dated Nov. 2, 2006.
PCT/US2005/016764; International Preliminary Report on Patentability dated Nov. 23, 2006.
PCT/US2005/010756, International Search Report and Written Opinion dated Oct. 12, 2006.
PCT/US2005/010756, International Preliminary Report on Patentability dated Apr. 12, 2007.
PCT/US2005/039307, International Search Report and Written Opinion dated Sep. 26, 2006.
PCT/US2005/013336, International Preliminary Report on Patentability dated Nov. 9, 2006.
Howard W. Markstein, Western Editor, Rigid-Flex: A Maturing Technology dated Feb. 1996, Electronic Packaging & Production.
Design Requirements for Outlines of Solid State and Related Products, Ball Grid Array Package (BGA), Sep. 2005, Jedec Publication 95.
William R. Newberry, Xynetic Design Systems, Inc., Design Techniques for Ball Grid Arrays, 1997 published on the Internet.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the internet.
Chip Scale Review Online—An Independent Journal Dedicated to the Advancement of Chip-Scale Electronics. (Website 9 pages) Fjelstad, Joseph. Pacific Consultants L.L.C., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel, "Stacked-CSP Delivers Flexiblity, Reliability, and Space-Saving Capabilities". vol. 3, Spring 2002. Published on Internet.
Tessera Technologies, Inc.—Semiconductor Intellectual Property. Chip Scale Packaging—Website pages (3). Internet.
Tessera Introduces uZ a —Ball Stacked Memory Package for Computing and Portable Electronic Products Joyce Smeragdis. Tessera Public Relations. Sandy Skees, MCA PR (www.tessera.com/news_events/press_coverage.cfm): 2 figures that purport to be directed to the uZ #—Ball Stacked Memory Package. Published Jul. 17, 2002 in San Jose, CA.
William R. Newberry, Design Techniques for Ball Grid Arrays, Xynelix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W Baggs. Unitive Electronics Inc.
Dense-Pac Microsystems. 16 Megabit High Speed CMOS SRAM DPS1MX16MKn3.
Dense-Pac Microsystems. 256 Megabyte CMOS DRAM DP3ED32MS72RW5.
Dense-Pac Microsystems. Breaking Space Barriers. 3-D Technology 1993.
Dense-Pac Microsystems. DPS512X16A3. Ceramic 512K×16 CMOS SRAM Module.
IBM Preliminary 168 Pin SDRAM Registered DIMM Functional Description & Timing Diagrams.

3D Interconnection for Ultra-Dense Multichip Modules; Christian Val. Thomson-CSF DCS Computer Division, Thierry Lemoine, Thomson-CSF RCM Radar Countermeasures Division.

High Density Memory Packaging Technology High Speed Imaging Applications, Dean Frew. Texas Instruments Incorporated.

Verticany-Intergrated Package. Alvin Weinberg. Pacesetter, Inc. and W. Kinzy Jones. Florida International University.

1992 Proceedings, 42nd Electronic Components & Technology Conference. May 18-20, 1992.

Research Disclosure. Organic Card Device Carrier, 31318. May 1990, No. 313.

IBM Technical Disclosure Bulletin, vol. 23, No. 12, May 1981.

IBM Technical Disclosure Bulletin, vol. 20, No. 11A, Apr. 1976.

IBM Technical Disclosure Bulletin, vol. 32, NO. 3B, Aug. 1989.

Orthogonal Chip Mount - A 3D Hybrid Wafer Scale Integration Technology, International Electron Device Meeting, IEDM Technical Digest, Washington, D.C., Dec. 6-9, 1987.

* cited by examiner

STACKED MODULE SYSTEMS AND METHOD

RELATED APPLICATIONS

This application is a continuation of U.S. patent application Ser. No. 11/131,812 filed May 18, 2005, now U.S. Pat. No. 7,033,861 B1, which is incorporated herein for all purposes.

U.S. patent application Ser. No. 10/453,398, filed Jun. 3, 2003, is incorporated herein by reference for all purposes.

TECHNICAL FIELD

The present invention relates to aggregating integrated circuits and, in particular, to methods for creating high density modules from chip-scale type devices.

BACKGROUND OF THE INVENTION

A variety of techniques are used to stack packaged integrated circuits. Some methods require special packages, while other techniques stack conventional packages.

The predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packaging or "CSP" have recently gained market share.

CSP refers generally to packages that provide connection to an integrated circuit through a set of contacts (often embodied as "bumps" or "balls") arrayed across a major surface of the package. Instead of leads emergent from a peripheral side of the package, contacts are placed on a major surface and typically emerge from the planar bottom surface of the package. The absence of "leads" on package sides renders most stacking techniques devised for leaded packages inapplicable for CSP stacking.

A variety of previous techniques for stacking CSPs may present complex assembly problems. What is needed, therefore, is a technique and system for stacking CSPs that provides a thermally-efficient, reliable structure that performs well at higher frequencies but does not add excessive height to the stack yet allows efficient production at reasonable cost with readily understood and managed materials and methods.

SUMMARY OF THE INVENTION

The present invention stacks chip scale-packaged integrated circuits (CSPs) into modules that conserve PWB or other board surface area. Although the present invention is applied most frequently to chip scale packages that contain one die, it may be employed with chip scale packages that include more than one integrated circuit die. Multiple numbers of CSPs may be stacked in accordance with the present invention. The CSPs employed in stacked modules devised in accordance with the present invention are connected with flex circuitry. That flex circuitry may exhibit one or two or more conductive layers.

A combination composed from a form standard and a CSP is attached to flex circuitry. Solder paste is applied to first selected locations on the flex circuitry and adhesive is applied to second selected locations on the flex circuitry. The flex circuitry and the combination of the form standard and CSP are brought into proximity with each other. During solder reflow operation, a force is applied that tends to bring the combination and flex circuitry closer together. As the heat of solder reflow melts the contacts of the CSP, the combination collapses toward the flex circuitry displacing the adhesive as the solder paste and contacts merge into solder joints. In a preferred embodiment, the form standard will be devised of heat transference material, a metal, for example, such as copper would be preferred, to improve thermal performance. In other embodiments, the methods of the invention may be used to attach a CSP without a form standard to flex circuitry.

DESCRIPTION OF PREFERRED EMBODIMENTS

Figure 1:
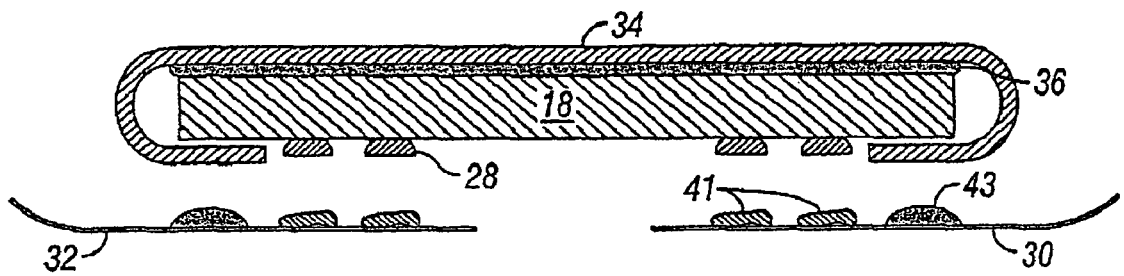
FIG. 1 illustrates a step in a prior art method for constructing a high-density circuit module.
Figure 2:
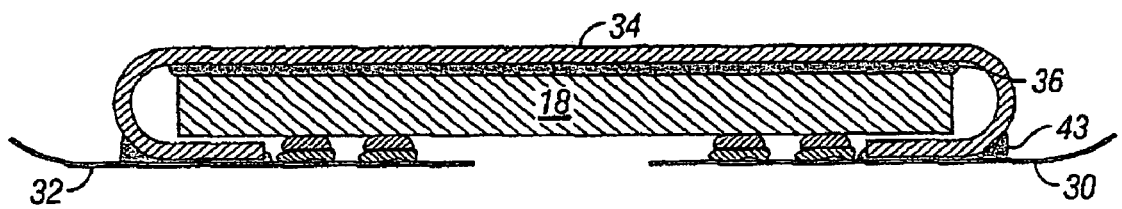
FIG. 2 depicts a step in a prior art method for constructing a high-density circuit module.
Figure 3:
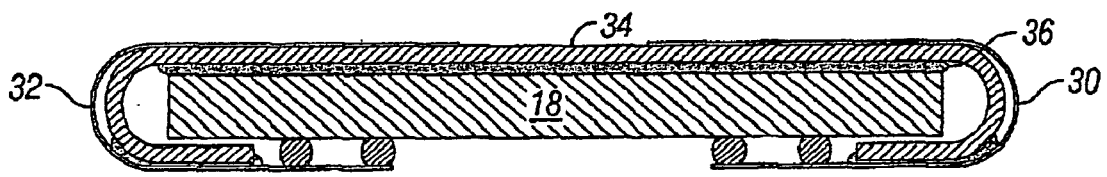
FIG. 3 depicts a step in a prior art method for constructing a high-density circuit module.

FIGS. 1-3 depict steps in a prior art method for constructing a high-density circuit module. FIG. 1 depicts a CSP 18 attached with adhesive 36 to form standard 34. In the configurations depicted, form standard 34 is devised to be employed with a CSP to provide a standard form for flex circuitry connector(s). Contacts 28 of CSP 18 have been compressed in a solid or semi-solid state and solder paste 41 and adhesive 43 have been applied to flex circuitry 30 and 32. FIG. 2 depicts a step in a prior art method for construction of a high-density module. Contacts 28 and solder paste sites 41 have come into contact as have form standard 34 and adhesive sites 43. FIG. 3 illustrates how solder paste sites 41 and compressed contacts 28 have merged to form solder joints and flex circuitry 30 and 32 has been wrapped about CSP 18.

Figure 4:
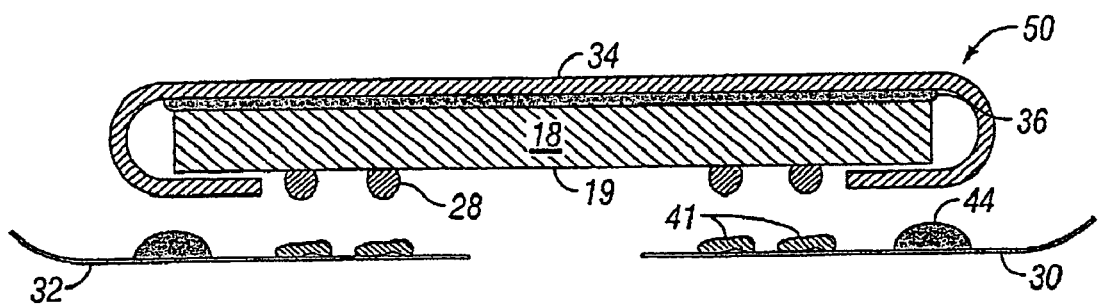
FIG. 4 depicts a step in a method for constructing a high-density circuit module in accordance with a preferred embodiment of the present invention.

FIG. 4 depicts a method in accordance with a preferred embodiment of the present invention. CSP 18 and form standard 34 are attached with adhesive 36 to form a primary combination 50. The depicted configuration of form standard 34 is one of many that can provide a standard form about which flex circuitry may be disposed. This allows a connective design implemented in flex circuitry to be used with CSPs of a variety of designs and configurations. Form standard 34 may also provide thermal advantages particularly when devised from metallic materials such as copper and copper alloys for example. Other configurations of form standard 34 may be employed with the present invention including but not limited to those that extend across the bottom surface 19 of CSP 18. Further, some form standards may not extend beyond the perimeter of CSP 18. Still other embodiments may not employ a form standard and may use the methods of the present invention to affix flex circuitry to CSP bodies.

Flex circuitry in this embodiment is comprised of flex circuits 30 and 32. Other embodiments may use one contiguous flex circuit or several and the flex circuitry may be flexible throughout or flexible in some areas and rigid in other areas. Flex circuitry has solder paste applied at selected sites as represented by reference 41 and an adhesive at selected sites identified by reference 44. The adhesive is, preferably, a thermoset adhesive or epoxy that will not soften during subsequent reflow operations such as exposure to 200-250 degrees Centigrade, for example.

Figure 5:
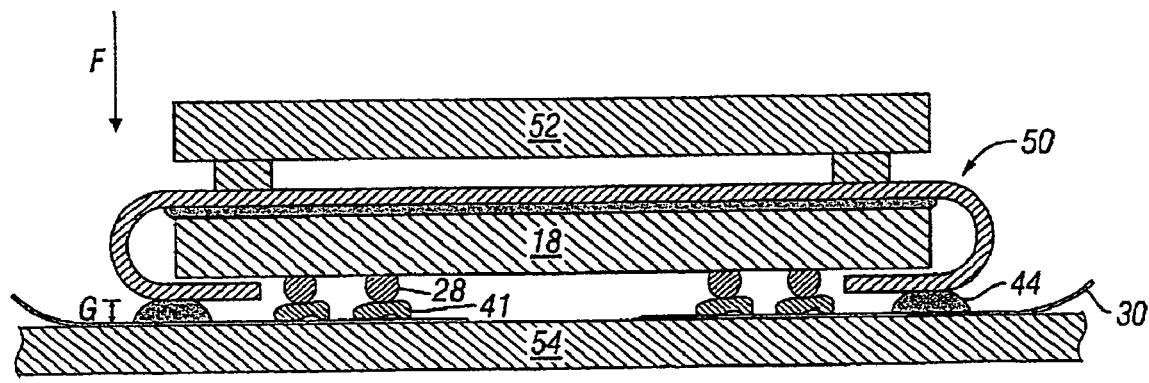
FIG. 5 depicts a step in a method for construction of a high-density circuit module in accordance with a preferred embodiment of the present invention.

In FIG. 5, the primary combination and the flex circuitry have been disposed in proximity to each other. Typically, there will be contact between contacts 28 and solder paste sites 41 but a large gap "G" between flex circuitry and form standard 34 will be exhibited because primary combination 50 is suspended above flex circuits 30 and 32 by the adhesive 44 and the uncompressed height of contacts 28 and solder paste 41. Weight 52 is disposed above CSP 18 on primary combination 50 while flex circuits 30 and 32 are supported from beneath by work support 54. Work support 54 is preferably a carrier that is in motion through an assembly process or may be stationary. Primary combination 50 and the flex circuitry are subjected to a solder reflow operation examples of which are well known to those of skill in the art.

Figure 6:
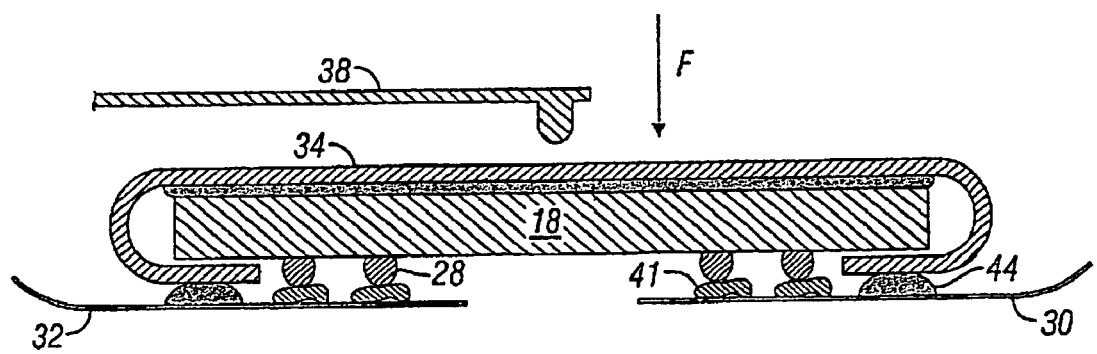
FIG. 6 depicts a step in a method for construction of a high-density circuit module in accordance with a preferred embodiment of the present invention.
Figure 7:
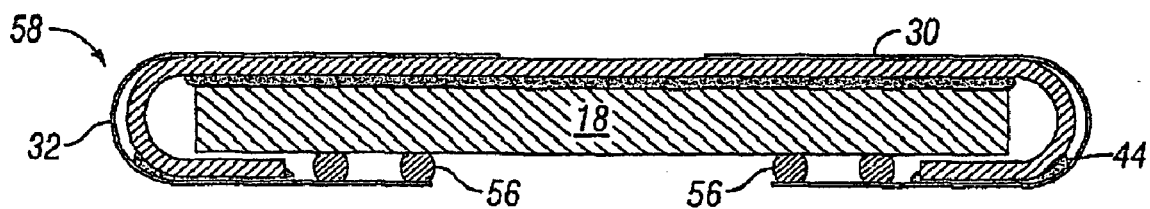
FIG. 7 depicts a high-density circuit module in accordance with a preferred embodiment of the present invention.

With primary combination 50 and flex circuits 30 and 32 under force F which tends to move them closer together, primary combination 50 collapses toward the flex circuitry as contacts 28 melt in the solder reflow operation and merge with the solder paste on flex circuits 30 and 32 to form solder joints 56 as adhesive 44 is compressed as well. In preferred modes, adhesive 44 cures after the solder has melted. Unit 58 is formed by such a process and comprises CSP 18, form standard 34 and flex circuitry 30 and 32. A unit 58 devised in accordance with the preferred methods described is shown in FIG. 7. After appreciating this specification those of skill will recognize that force F may be applied by several methods and apparatus including weights and fixtures that apply force F during the reflow operation that melts contacts 28. An alternate system using a fixture 38 to apply force F is shown in FIG. 6. These processes are amenable to implementation in a standard pick and place operation. Once devised, unit 58 may then be employed as a unit in a stacked module such as that shown in FIG. 8.

Figure 8:
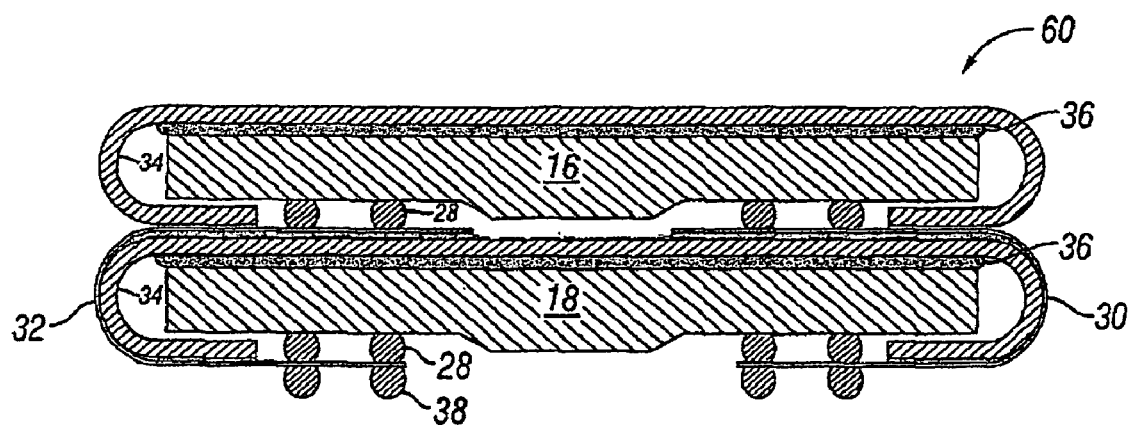

FIG. 8 depicts a high-density circuit module 60 comprised of unit 58 in combination with upper CSP 16 which has its own attached form standard 34. To form module 60, one or more upper CSPs 16 may be combined with unit 58. When aggregating more than two CSPs in a module 60, further iterations of flex circuitry will typically be employed as those of skill will understand. Each of the upper CSPs may optionally include an upper form standard 34 such as the one illustrated in FIG. 8 associated with upper CSP 16. Module 60 is shown with module contacts 38.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A method for devising a high-density circuit module, the method comprising the steps of:
   providing a first CSP having contacts;
   providing flex circuitry;
   disposing the first CSP and the flex circuitry in proximity to each other; and
   applying a force to move the first CSP toward the flex circuitry during a solder reflow operation.

2. The method of claim 1 in which the step of applying force to move the first CSP toward the flex circuitry comprises placing a weight on the first CSP.

3. The method of claim 1 in which the step of applying force to move the first CSP toward the flex circuitry comprises applying a downward force on the first CSP with a fixture while the flex circuitry is supported from beneath.

4. The method of claim 1 in which the flex circuitry comprises at least two conductive layers.

5. The method of claim 1 further comprising the steps of:
   providing a second CSP;
   disposing the second CSP above the first CSP; and
   connecting the first and second CSPs with the flex circuitry.

6. The method of claim 5 in which the flex circuitry comprises at least two conductive layers.

7. A high-density circuit module devised in accordance with the method of claim 1.

8. A method for devising a high-density circuit module, the method comprising the steps of:
   providing a first CSP having a planar surface rising above which are contacts;
   providing a flex circuit upon which is located solder paste at first selected sites and adhesive at second selected sites;
   disposing the first CSP adjacent to the flex circuit to realize areas of contact between the contacts and the first selected sites;
   applying a force to the first CSP during a solder reflow operation to move the first CSP and flex circuit closer together while displacing the adhesive.

9. The method of claim 8 in which the flex circuit comprises two conductive layers.

10. The method of claim 9 in which the displaced adhesive cures after the solder reflow operation.

11. The method of claim 8 further comprising the step of disposing a second CSP above the first CSP and connecting the flex circuit to the second CSP.

12. The method of claim 11 in which the flex circuit comprises two conductive layers.

13. The method of claim 12 in which the displaced adhesive cures after the solder reflow operation.

14. A method for devising a high-density circuit module, the method comprising the steps of:
   providing a first CSP having a first major surface and a second major surface along which are disposed contacts;
   providing a flex circuit having a first end portion;
   disposing the first CSP and the flex circuit in proximity to each other;

applying a force to move the first CSP toward the flex circuitry;

performing a solder reflow operation to connect the contacts of the first CSP to the flex circuit; and disposing the first end portion of the flex circuit along at least a first portion of the first major surface of the first CSP.

15. The method of claim 14 further comprising the step of attaching the first end portion of the flex circuit to at least part of the first portion of the first major surface of the first CSP with adhesive.

16. The method of claim 14 in which the flex circuit further comprises a second end portion, and the method further comprises the step of disposing the second end portion of the flex circuit along at least a second portion of the first major surface of the first CSP.

17. The method of claim 16 further comprising the steps of:

attaching the first end portion of the flex circuit to at least part of the first portion of the first major surface of the first CSP with adhesive; and attaching the second end portion of the flex circuit to at least part of the second portion of the first major surface of the first CSP with adhesive.

18. The method of claim 14 further comprising the steps of:

disposing a second CSP in a stacked configuration with the first CSP; and connecting the second CSP to the first end portion of the flex circuit.

19. The method of claim 15 further comprising the steps of:

disposing a second CSP in a stacked configuration with the first CSP; and connecting the second CSP to the first end portion of the flex circuit.

20. The method of claim 16 further comprising the steps of:

disposing a second CSP in a stacked configuration with the first CSP;

connecting the second CSP to the first end portion of the flex circuit; and connecting the second CSP to the second end portion of the flex circuit.

21. The method of claim 17 further comprising the steps of:

disposing a second CSP in a stacked configuration with the first CSP;

connecting the second CSP to the first end portion of the flex circuit; and connecting the second CSP to the second end portion of the flex circuit.

* * * * *